(12) United States Patent
Rofougaran

(10) Patent No.: US 8,750,414 B2
(45) Date of Patent: Jun. 10, 2014

(54) METHOD AND SYSTEM FOR POLAR MODULATION WITH DISCONTINUOUS PHASE

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 1031 days.

(21) Appl. No.: 11/928,248

(22) Filed: Oct. 30, 2007

(65) Prior Publication Data
US 2009/0034653 A1 Feb. 5, 2009

Related U.S. Application Data

(60) Provisional application No. 60/953,081, filed on Jul. 31, 2007.

(51) Int. Cl.
*H04K 1/02* (2006.01)
*H04L 25/49* (2006.01)

(52) U.S. Cl.
USPC .......................................... 375/297; 375/296

(58) Field of Classification Search
USPC .......................... 375/296, 297, 298, 295, 261
See application file for complete search history.

(56) References Cited

U.S. PATENT DOCUMENTS

| | | | |
|---|---|---|---|
| 5,420,536 A | 5/1995 | Faulkner et al. | |
| 5,535,245 A | 7/1996 | Kim | |
| 6,078,628 A | 6/2000 | Griffith et al. | |
| 6,438,360 B1 | 8/2002 | Alberth, Jr. et al. | |
| 6,900,693 B2 | 5/2005 | Sasho et al. | |
| 6,996,191 B1 | 2/2006 | Meditz | |
| 7,092,683 B2 | 8/2006 | Tanaka et al. | |
| 7,519,336 B2 | 4/2009 | Vepsalainen et al. | |
| 7,693,494 B2* | 4/2010 | Litmanen et al. | 455/91 |
| 7,696,821 B2 | 4/2010 | Rofougaran | |
| 2002/0121935 A1* | 9/2002 | Ko | 330/296 |

(Continued)

FOREIGN PATENT DOCUMENTS

| | | |
|---|---|---|
| EP | 0 708 546 | 4/1996 |
| EP | 1 035 701 | 9/2000 |
| WO | WO 2004/100483 | 11/2004 |
| WO | WO 2006/117589 | 11/2006 |

OTHER PUBLICATIONS

Non-Final Office Action mailed Apr. 26, 2010, U.S. Appl. No. 11/864,861, filed Sep. 28, 2007, Rofougaran.

(Continued)

*Primary Examiner* — Qutbuddin Ghulamali
(74) *Attorney, Agent, or Firm* — Oblon, Spivak, McClelland, Maier & Neustadt, L.L.P.

(57) ABSTRACT

Aspects of a method and system for polar modulation with discontinuous phase are provided. In this regard, in-phase and quadrature-phase components may be generated from a modulated baseband signal, and the signal components may be utilized to generate a signal representative of the amplitude of the baseband signal. Furthermore, the signal components may be pulse shaped and the pulse-shaped components may be divided by the signal representative of the amplitude of the baseband signal. The resulting signals may be up-converted to RF, summed, and amplified, where the amplification may be controlled via a quantized representation of the signal representative of the amplitude of the baseband signal. In this regard, one or more bias points, and/or one or more binary weighted current sources coupled to one or more power amplifiers may be controlled. The pulse-shaping may comprise passing the signal components through a raised cosine filter.

24 Claims, 5 Drawing Sheets

(56) References Cited

U.S. PATENT DOCUMENTS

| | | | |
|---|---|---|---|
| 2005/0100105 A1* | 5/2005 | Jensen | 375/259 |
| 2005/0159177 A1 | 7/2005 | Tachewsky et al. | |
| 2005/0195918 A1* | 9/2005 | Matsuura et al. | 375/295 |
| 2006/0045205 A1 | 3/2006 | Jensen | |
| 2006/0227895 A1* | 10/2006 | Booth et al. | 375/296 |
| 2009/0034642 A1 | 2/2009 | Rofougaran et al. | |
| 2009/0036072 A1 | 2/2009 | Rofougaran | |

OTHER PUBLICATIONS

Final Office Action mailed Sep. 10, 2010, U.S. Appl. No. 11/864,861, filed Sep. 28, 2007, Rofougaran.

Non-Final Office Action mailed Jun. 21, 2010, U.S. Appl. No. 11/876,037, filed Oct. 22, 2007, Rofougaran.

Final Office Action mailed Oct. 27, 2010, U.S. Appl. No. 11/876,037, filed Oct. 22, 2007, Rofougaran.

* cited by examiner

METHOD AND SYSTEM FOR POLAR MODULATION WITH DISCONTINUOUS PHASE

CROSS-REFERENCE TO RELATED APPLICATIONS/INCORPORATION BY REFERENCE

This patent application makes reference to, claims priority to and claims benefit from U.S. Provisional Patent Application Ser. No. 60/953,081 filed on Jul. 31, 2007.

The above stated application is hereby incorporated herein by reference in its entirety.

FIELD OF THE INVENTION

Certain embodiments of the invention relate to signal processing. More specifically, certain embodiments of the invention relate to a method and system for polar modulation with discontinuous phase.

BACKGROUND OF THE INVENTION

Electronic communications are becoming an increasingly common and important part of everyday life. In this regard, people are relying more and more on electronic devices for reliable and timely communication of all types of information including voice, data, and multimedia. Accordingly, as the number of electronic devices enabled for wireline and/or mobile communications continues to increase, system designer are in a constant search for ways to improve their product and ultimately sell more devices. In this regard, significant efforts exist with regard to making electronic communication devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for polar modulation with discontinuous phase, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for polar modulation with continuous phase. In this regard, in-phase and quadrature-phase components may be generated from a modulated baseband signal, and the signal components may be utilized to generate a signal representative of the amplitude of the baseband signal. Furthermore, the signal components may be pulse shaped and the pulse-shaped components may be divided by the signal representative of the amplitude of the baseband signal. The resulting signals may be up-converted to RF, summed, and amplified, where the amplification may be controlled via a quantized representation of the signal representative of the amplitude of the baseband signal. In this regard, one or more bias points, and/or one or more binary weighted current sources coupled to one or more power amplifiers may be controlled. The pulse-shaping may comprise passing the signal components through a raised cosine filter. A number of power amplifiers equal to the number of quantization levels of the signal representative of the amplitude of the baseband signal may be utilized for the amplification. Also, the number of quantization levels may be determined based on the modulation present in the baseband signal. In various embodiments of the invention, the signal may be a QAM signal.

Figure 1:
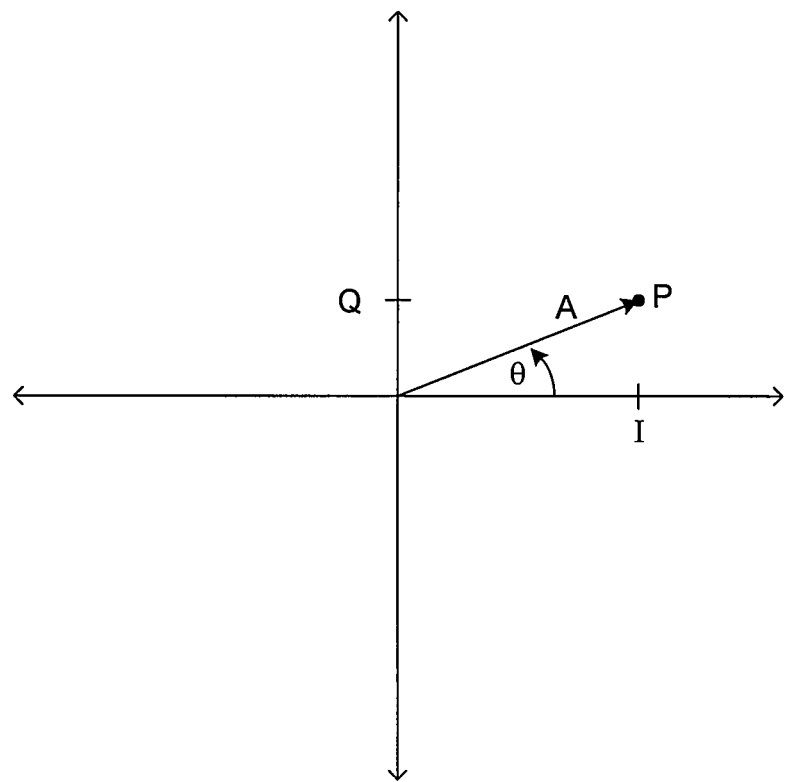
FIG. 1 is graph illustrating the relationship between Cartesian coordinates and polar coordinates, in connection with an embodiment of the invention.

FIG. 1 is graph illustrating the relationship between Cartesian coordinates and polar coordinates, in connection with an embodiment of the invention. Polar modulation is related to quadrature modulation in the same way that the polar coordinate system is related to the Cartesian coordinate system. In a Cartesian coordinate system, a point, P, is represented by two signals of amplitudes I and Q respectively. With quadrature modulation it is often difficult to separate phase modulation from amplitude modulation and, as a result, the combined I and Q signal going to an amplifier has non-constant amplitude. Thus, signals generated with quadrature modulation often require linear amplifiers for transmission in order to preserve the integrity of the varying amplitude signal. Moreover, the linear amplifiers need to be operated at well below their 1-dB compression point. This may result in increased power consumption due to the larger conduction angles of linear power amplifiers.

In a polar coordinate system the same point, P, is represented by only one signal with magnitude R and a phase θ. Polar modulation makes use of a polar coordinate system, wherein a signal is represented by a magnitude R and a phase θ, allowing phase modulation and amplitude modulation to be performed independently. In this way, a polar modulated signal may be generated with one phase change and one amplitude change of one carrier signal.

Figure 2:
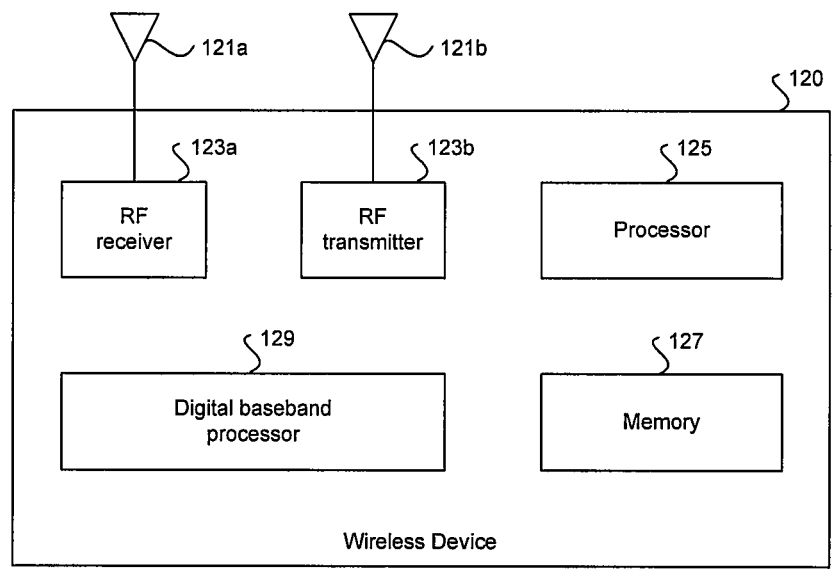
FIG. 2 is a block diagram illustrating an exemplary wireless device, in accordance with an embodiment of the invention.

FIG. 2 is a block diagram illustrating an exemplary wireless device, in accordance with an embodiment of the invention. Referring to FIG. 2, there is shown a wireless device 120 that may comprise an RF receiver 123a, an RF transmitter 123b, a digital baseband processor 129, a processor 125, and a memory 127. A receive antenna 121a may be communicatively coupled to the RF receiver 123a. A transmit antenna 121b may be communicatively coupled to the RF transmitter 123b. The wireless device 120 may be operated in a system, such as the cellular network and/or digital video broadcast network, for example.

The RF receiver 123a may comprise suitable logic, circuitry, and/or code that may enable processing of received RF signals. The RF receiver 123a may enable receiving RF signals in a plurality of frequency bands. For example, the RF receiver 123a may enable receiving signals in cellular frequency bands. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the wireless device 120 may comprise more than one RF receiver 123a, wherein each of the RF receiver 123a may be a single-band or a multi-band receiver.

The RF receiver 123a may down convert the received RF signal to a baseband signal that comprises an in-phase (I) component and a quadrature (Q) component. The RF receiver 123a may perform direct down conversion of the received RF signal to a baseband signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network.

The RF transmitter 123b may comprise suitable logic, circuitry, and/or code that may enable processing of RF signals for transmission. The RF transmitter 123b may enable transmission of RF signals in a plurality of frequency bands. For example, the RF transmitter 123b may enable transmitting signals in cellular frequency bands. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the wireless device 120 may comprise more than one RF transmitter 123b, wherein each of the RF transmitter 123b may be a single-band or a multi-band transmitter.

The RF transmitter 123b may quadrature up convert the baseband signal comprising I/Q components to an RF signal.

The RF transmitter 123b may perform direct up conversion of the baseband signal to a RF signal, for example. In conventional systems, RF transmitters may comprise one or more power amplifier which may utilize significant amounts of power. However, the RF transmitter 123b may comprise suitable logic, circuitry, and/or code to improve the power efficiency. In this regard, the RF transmitter 123b may modulate a baseband signal onto an RF carrier as described with respect to FIGS. 3a and 3b, below. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the wireless device 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the wireless device 120. The processor 125 may also enable executing of applications that may be utilized by the wireless device 120. For example, the processor 125 may execute applications that may enable displaying and/or interacting with content received via cellular transmission signals in the wireless device 120.

The memory 127 may comprise suitable logic, circuitry, and/or code that may enable storage of data and/or other information utilized by the wireless device 120. For example, the memory 127 may be utilized for storing processed data generated by the digital baseband processor 129 and/or the processor 125. The memory 127 may also be utilized to store information, such as configuration information, that may be utilized to control the operation of at least one block in the wireless device 120. For example, the memory 127 may comprise information necessary to configure the RF receiver 123a to enable receiving cellular transmission in the appropriate frequency band.

Figure 3A:
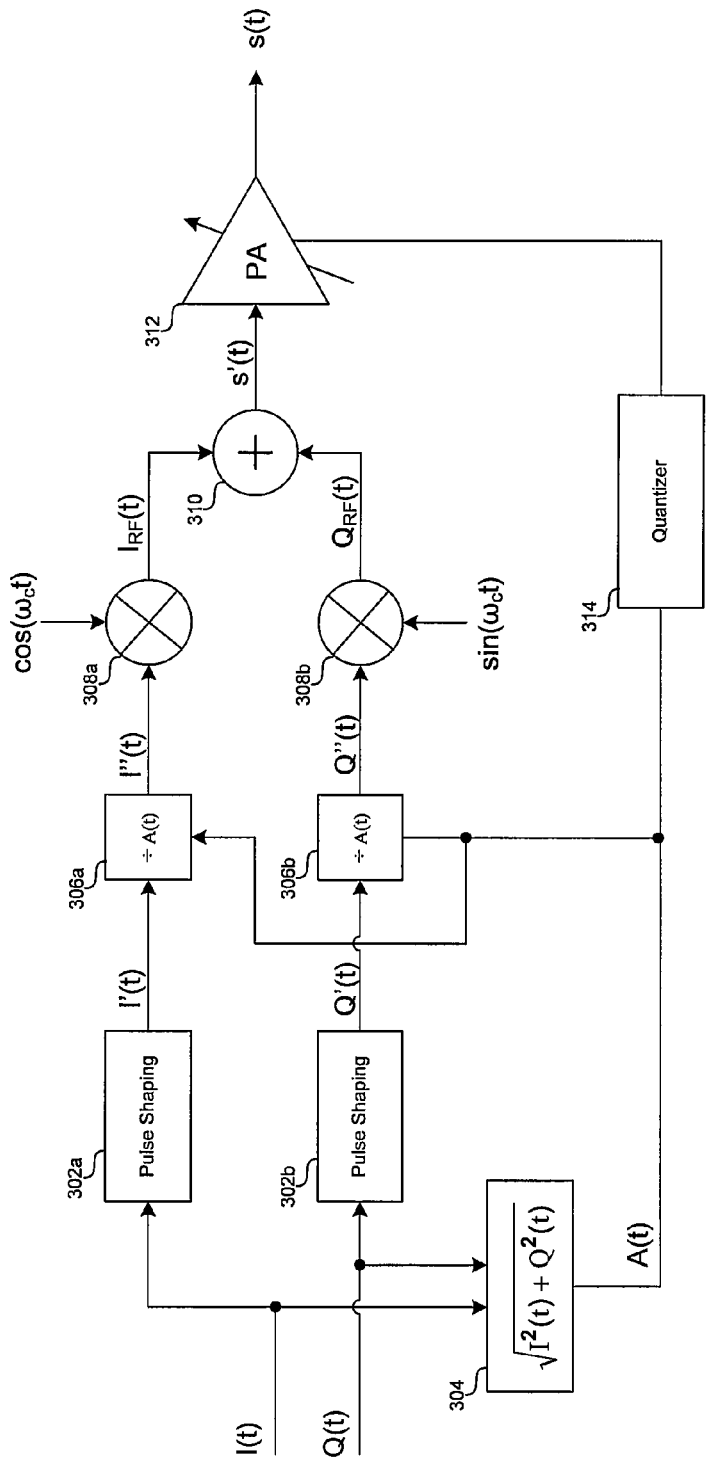
FIG. 3a is a block diagram illustrating an exemplary architecture for polar modulating a signal utilizing a digitally controlled power amplifier, in accordance with an embodiment of the invention.

FIG. 3a is a block diagram illustrating an exemplary architecture for signal processing and transmission, in accordance with an embodiment of the invention. Referring to FIG. 3a there is shown a portion of an RF transmitter comprising two pulse shaping circuits 302a and 302b, amplitude calculation block 304, division blocks 306a and 306b, mixers 308a and 308b, a summing circuit 310, a quantizer 314, and power amplifier (PA) 312.

The pulse shaping circuits 302a and 302b may comprise suitable logic, circuitry, and/r code that may enable filtering, equalizing, compressing, or otherwise processing and/or conditioning the signals I(t) and Q(t) to generate I'(t) and Q'(t), respectively. In various embodiments of the invention, the pulse shaping circuits 302a and 302b may comprise a raised cosine filter.

The amplitude calculation block 304 may comprise suitable logic, circuitry, and/or code that may enable performing the following calculation:

$$A(t) = \sqrt{I^2(t) + Q^2(t)} \qquad \text{EQ. 1}$$

where I(t) and Q(t) are in-phase and quadrature-phase, respectively, components of an input baseband signal and A(t) represents an amplitude of the input baseband signal. In various embodiments of the invention, the calculation may be carried out in the analog domain, the digital domain, or a combination thereof. In various embodiments of the invention, the amplitude calculation block 304 may comprise one or more processors or may be implemented in one or more processors.

The division or divider blocks 306a and 306b may comprise suitable logic, circuitry, and/or code that may enable dividing one baseband signal by another. In various embodiments of the invention, the calculation may be carried out in the analog domain, the digital domain, or a combination thereof. In various embodiments of the invention, the amplitude calculation block 304 may comprise one or more processors or may be implemented in one or more processors.

The mixers 308a and 308b may comprise suitable logic, circuitry, and/or code that may enable generation of inter-modulation products resulting from the mixing of a baseband signal and a RF carrier from, for example, a local oscillator. The mixer 308a may, for example, be enabled to utilize an in-phase carrier signal to generate in-phase inter-modulation products. The mixer 308b may, for example, be enabled to utilize a quadrature phase LO signal to generate quadrature phase inter-modulation products. The frequency of the carrier signals may be determined based on the desired radio frequency for transmission. In this regard, the mixers 308a and 308b may enable up-converting, for example, baseband signals of a fixed frequency to a variable radio frequency for transmission The summing circuit 310 may comprise suitable logic, circuitry, and/or code that may enable adding an in-phase component and a quadrature-phase component to generate a phase modulate RF signal. In various embodiments of the invention, the calculation may be carried out in the analog domain, the digital domain, or a combination thereof. In various embodiments of the invention, the summing circuit 310 may comprise one or more processors or may be implemented in one or more processors.

The power amplifier (PA) 320 may comprise suitable logic, circuitry, and/or code that may enable buffering and/or amplification of a RF signal and outputting the signal to an antenna for transmission. In this regard, the gain of the PA 312 may be adjustable and may enable transmitting signals of varying strength. In this regard, the PA 312 may enable amplitude modulating an RF signal input to the PA 312. For example, the PA 312 may comprise a binary weighted current source that may enable controlling the gain. Similarly, one or more power regulators supplying the PA 312 may be controlled to alter the gain of the PA 312.

The quantizer 314 may comprise suitable logic circuitry, and/or code that may enable converting the analog signal A(t) to a digital or quantized representation. In this regard, generating A(t) from I(t) and Q(t) may result in A(t) comprising a discrete number of amplitudes. Accordingly, A(t) may be quantized without introducing significant quantization error. On the other hand, generating A(t) from I'(t) and Q'(t), may result in significant quantization error and loss of information.

In operation, a baseband signal may be split into in-phase, I(t), and quadrature-phase, Q(t), components. The signal components may be conveyed to the amplitude calculation block 304 where A(t) may be generated. In this regard, generating A(t) prior to pulse shaping I(t) and Q(t) may allow the signal A(t) to be based on the modulation without introducing additional signal variations due to the pulse shaping. Accordingly, the signal A(t) may comprise a discrete number of levels based on the modulation of the signals I(t) and Q(t). For example, in a 16-QAM modulation scheme, A(t) may comprise 4 discrete levels. Accordingly, A(t) may be quantized and the quantized signal may be utilized to control the Power Amplifier 312. For example, one or more bias points for the PA 312 may be controlled, via a binary weighted current source, by the quantized amplitude signal. In this manner, design of the power amplifier may be simplified since it only needs to operate at a discrete, and relatively small number of bias points. On the contrary, if A(t) is calculated utilizing I'(t) and Q'(t), then A(t) may become distorted and/or may comprise an increased number of amplitudes, thus increasing the complexity of the PA 312 and/or control of the PA 312.

I(t) and Q(t) may be conveyed to the pulse shaping circuits 302a and 302b, respectively, to generate I'(t) and Q'(t). Subsequently, I'(t) and Q'(t) may, respectively, be conveyed to the division blocks 306a and 306b. The division blocks 306a and 306b may divide I'(t) and Q'(t) by A(t) to generate I"(t) and Q"(t). In this regard, I"(t) and Q"(t) may comprise primarily phase information, but there may also be amplitude variations in the signals I"(t) and Q"(t) due to the pulse shaping.

I"(t) and Q"(t) may, respectively, be mixed with in-phase and quadrature-phase components of an RF carrier signal to generate $I_{RF}(t)$ and $Q_{RF}(t)$. Subsequently, $I_{RF}(t)$ and $Q_{RF}(t)$ may be summed to generate the signal s'(t), a carrier signal phase modulated by the baseband signal. Next, s'(t) may be conveyed to the PA 312. The gain of the PA 312 may be controlled via the quantized signal $A_q(t)$ such that the transmitted signal, s(t), is a RF carrier polar modulated by the baseband signal. In one embodiment of the invention, $A_q(t)$ may control a binary weighted current source comprising the PA 312.

Figure 3B:
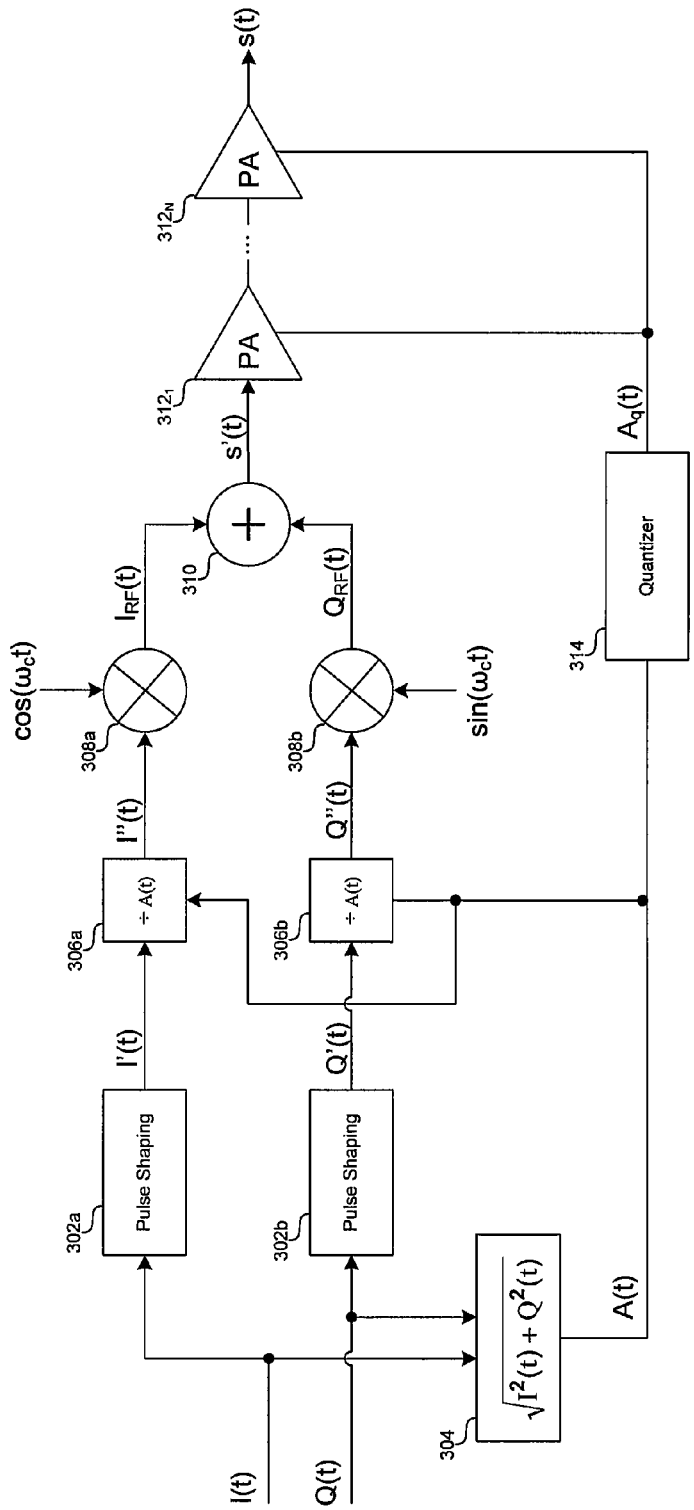
FIG. 3b is a block diagram illustrating an exemplary architecture for polar modulating a signal utilizing a digitally controlled power amplifier, in accordance with an embodiment of the invention.

FIG. 3b is a block diagram illustrating an exemplary architecture for signal processing and transmission, in accordance with an embodiment of the invention. Referring to FIG. 3b there is shown a portion of an RF transmitter comprising two pulse shaping circuits 302a and 302b, amplitude calculation block 304, division blocks 306a and 306b, mixers 308a and 308b, a summing circuit 310, a quantizer 314, and power amplifiers (PA) $312_1 \ldots 312_N$.

The two pulse shaping circuits 302a and 302b, the amplitude calculation block 304, the division blocks 306a and 306b, the mixers 308a and 308b, the summing circuit 310, and the quantizer 314 may be as described with respect to FIG. 3a.

Each of the power amplifiers $312_1 \ldots 312_N$ may comprise suitable logic, circuitry, and/or code that may enable amplifying and/or buffering of an RF signal.

Additionally, the final power amplifier $312_N$ may comprise suitable logic, circuitry, and/or code for transmitting a signal via an antenna. Each PA $312_i$ may receive a digital signal that may enable configuring the gain of the amplifier $312_i$. In this manner, the quantized amplitude signal, $A_q(t)$ may control the overall gain of the cascaded amplifiers $312_1 \ldots 312_N$.

In an exemplary operation, the number of quantization levels output by the quantizer 314 may correspond to the number, N, of cascaded power amplifiers. For example, the $i^{th}$ bit output by the quantizer may control the gain of the PA $312_i$. In this manner, if the $i^{th}$ bit is asserted the PA 312 may apply a gain and it the $i^{th}$ bit is de-asserted the PA $312_i$ may simply buffer or simply pass the signal. In this regard, the design of the PAs $312_1 \ldots 312_N$ since each amplifier may need to only operate at a single bias point. Accordingly, by cascading 'N' PA's in series, with each PA capable of providing unity gain or gain 'G', the PAs $312_1 \ldots 312_N$ may be enabled to generate N output levels and thus amplitude modulate the output by the signal Aq(t).

Figure 4:
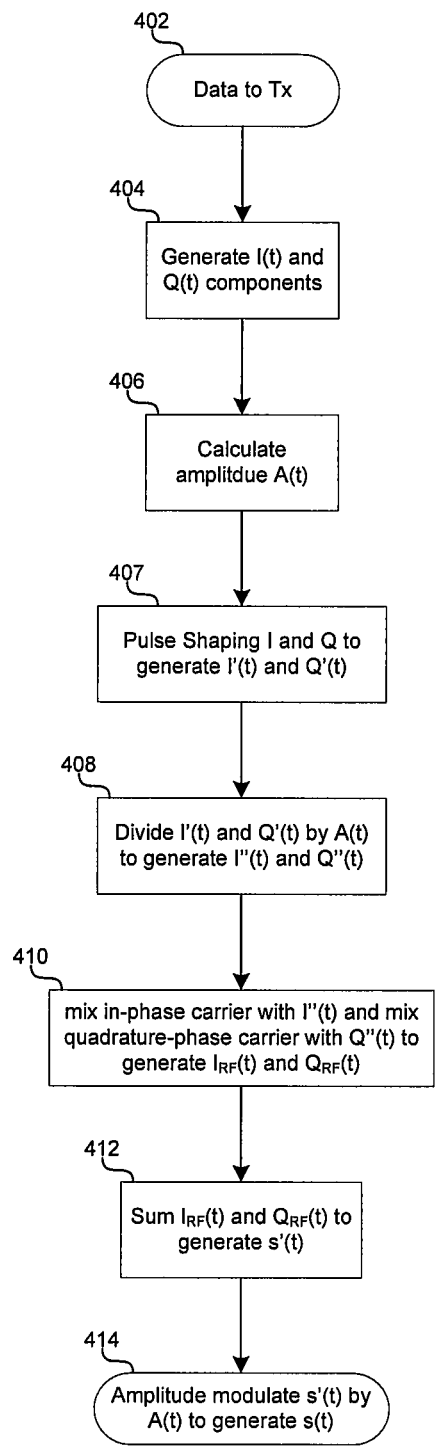
FIG. 4 is a flow chart illustrating the polar modulation of a carrier signal by a baseband signal, in accordance with an embodiment of the invention.

FIG. 4 is a flow chart illustrating the polar modulation of a carrier signal by a baseband signal, in accordance with an embodiment of the invention. Referring to FIG. 4 the exemplary steps may begin with step 402 when data is ready to be transmitted. The transmitted data may, for example, arrive at the RF transmitter 120b of FIG. 2. Subsequent to step 402, the exemplary steps may advance to step 404. In step 404, a baseband signal may be decomposed into in-phase and quadrature phase components. Subsequent to step 404, the exemplary steps may advance to step 406. In step 406, an amplitude component of a polar modulated output may be generated. In this regard, the amplitude, A(t), may be calculated as above in EQ. 1. Subsequent to step 406, the exemplary steps may advance to step 407. In step 407, the signals I(t) and Q(t) may be passed through pulse shaping circuits to generate signals I'(t) and Q'(t).

Subsequent to step 407, the exemplary steps may advance to step 408. In step 408, I(t) and Q(t) may each be divided by A(t) to generate I'(t) and Q'(t). Subsequent to step 408, the exemplary steps may advance to step 410. In step 410, I'(t) may be mixed with an in-phase component of an RF carrier signal to generate I"(t) and Q'(t) may be mixed with a quadrature-phase component of an RF carrier signal to generate Q"(t). Subsequent to step 410, the exemplary steps may advance to step 412. In step 412, I"(t) and Q"(t) may be combined to generate a phase modulated carrier signal s'(t). Subsequent to step 412, the exemplary steps may advance to step 414. In step 414, s'(t) may be conveyed to a power amplifier for amplitude modulation and transmission. In this regard, the gain of the PA may be controlled by A(t) to effectively amplitude modulate s'(t) resulting in the polar modulated signal s(t).

Aspects of a method and system for polar modulation with discontinuous phase are provided. In this regard, in-phase and quadrature-phase components, I(t) and Q(t), may be generated from a modulated baseband signal, and the signal components may be utilized to generate a signal, A(t), representative of the amplitude of the baseband signal. Furthermore, the signal components may be pulse shaped and the pulse-shaped components, I'(t) and Q'(t), may be divided by the signal A(t). The resulting signals, I"(t) and Q"(t), may be up-converted to RF, summed, and amplified, wherein said amplification may be controlled via a quantized representation, $A_q(t)$, of the signal representative of the amplitude of the baseband signal. In this regard, one or more bias points, and/or one or more binary weighted current sources coupled to one or more power amplifiers 312 may be controlled. The pulse-shaping may comprise passing the signal components through a raised cosine filter. A number of power amplifiers, N, equal to the number of quantization levels of said signal representative of the amplitude of the baseband signal may be utilized for the amplification. Also, the number of quantization levels may be determined based on the modulation present in the baseband signal. In various embodiments of the invention, the signal may be a QAM signal.

Another embodiment of the invention may provide a machine-readable storage, having stored thereon, a computer program having at least one code section executable by a machine, thereby causing the machine to perform the steps as described herein for polar modulation with discontinuous phase.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method comprising:
generating, from in-phase and quadrature-phase components of a modulated baseband signal, a first signal representative of an amplitude of said baseband signal and one or more second signals representative of a phase of said baseband signal;
phase modulating an RF carrier signal utilizing said one or more second signals;
inputting said phase modulated RF signal to a cascaded plurality of amplifiers; and
configuring said cascaded plurality of amplifiers to amplitude modulate said phase modulated signal, wherein;
said configuring is based on a quantized representation of said first signal;
each of said plurality of amplifiers is configurable into only two configurations, a first of said two configurations comprising an amplifying configuration, and a second of said two configurations comprising a buffering configuration or a pass-through configuration;
wherein the number of said cascaded plurality of amplifiers is determined based on said quantized representation of said first signal.

2. The method according to claim 1, wherein each possible value of said quantized representation of said first signal corresponds to a particular number of said amplifiers being configured into said amplifying configuration.

3. The method according to claim 1, further comprising pulse-shaping said in-phase and quadrature phase components, wherein said pulse-shaping comprises a raised cosine function.

4. The method according to claim 1, comprising controlling a bias point of said one or more power amplifiers utilizing said quantized representation of said signal representative of an amplitude of said baseband signal.

5. The method according to claim 4, comprising controlling said bias point via a binary weighted current source.

6. The method according to claim 1, wherein there is a one-to-one correspondence between amplifiers in said plurality of amplifiers and quantization levels utilized for said quantized representation of said first signal.

7. The method according to claim 1, wherein the number of quantization levels utilized for said quantized representation of said first signal is determined based on the modulation present in said baseband signal.

8. The method according to claim 7, wherein said baseband signal is a quadrature amplitude modulated (QAM) signal.

9. A non-transitory machine-readable storage having stored thereon, a computer program having at least one code section for signal processing, the at least one code section being executable by a machine for causing the machine to perform steps comprising:
generating, from in-phase and quadrature-phase components of a modulated baseband signal, a first signal representative of an amplitude of said baseband signal and one or more second signals representative of a phase of said baseband signal;
phase modulating an RF carrier signal utilizing said one or more second signals;
inputting said phase modulated RF signal to a cascaded plurality of amplifiers; and
configuring said cascaded plurality of amplifiers to amplitude modulate said phase modulated signal, wherein;
said configuring is based on a quantized representation of said first signal;
each of said plurality of amplifiers is configurable into only two configurations, a first of said two configurations comprising an amplifying configuration, and a second of said two configurations comprising a buffering configuration or a pass-through configuration;
wherein the number of said cascaded plurality of amplifiers is determined based on said quantized representation of said first signal.

10. The non-transitory machine-readable storage according to claim 9, wherein said at least one code section comprises code for wherein each possible value of said quantized representation of said first signal corresponds to a particular number of said amplifiers being configured into said amplifying configuration.

11. The non-transitory machine-readable storage according to claim 9, wherein said at least one code section comprises code for pulse-shaping said in-phase and quadrature phase components, wherein said pulse-shaping comprises a raised cosine function.

12. The non-transitory machine-readable storage according to claim 9, wherein said at least one code section comprises code for controlling a bias point of said one or more power amplifiers utilizing said quantized representation of said signal representative of an amplitude of said baseband signal.

13. The non-transitory machine-readable storage according to claim 12, wherein said at least one code section comprises code for controlling said bias point via a binary weighted current source.

14. The non-transitory machine-readable storage according to claim 9, wherein there is a one-to-one correspondence between amplifiers in said plurality of amplifiers and quantization levels utilized for said quantized representation of said first signal.

15. The non-transitory machine-readable storage according to claim 9, wherein the number of quantization levels utilized for said quantized representation of said first signal is determined based on the modulation present in said baseband signal.

16. The non-transitory machine-readable storage according to claim 15, wherein said baseband signal is a quadrature amplitude modulated (QAM) signal.

17. A system comprising:
one or more circuits operable to:
generate, from in-phase and quadrature-phase components of a modulated baseband signal, a first signal representative of an amplitude of said baseband signal and one or more second signals representative of a phase of said baseband signal;
phase modulate an RF carrier signal utilizing said one or more second signals;
input said phase modulated RF signal to a cascaded plurality of amplifiers; and
configure said cascaded plurality of amplifiers to amplitude modulate said phase modulated signal, wherein;
said configuration is based on a quantized representation of said first signal;
each of said plurality of amplifiers is configurable into only two configurations, a first of said two configurations comprising an amplifying configuration, and a second of said two configurations comprising a buffering configuration or a pass-through configuration;
wherein the number of said cascaded plurality of amplifiers is determined based on said quantized representation of said first signal.

18. The system according to claim 17, wherein each possible value of said quantized representation of said first signal corresponds to a particular number of said amplifiers being configured into said amplifying configuration.

19. The system according to claim 17, wherein said one or more circuits perform pulse-shaping of said in-phase and quadrature phase components, wherein said pulse-shaping comprises a raised cosine function.

20. The system according to claim 17, wherein said one or more circuits control a bias point of said one or more power amplifiers utilizing said quantized representation of said signal representative of an amplitude of said baseband signal.

21. The system according to claim 20, wherein said one or more circuits control said bias point via a binary weighted current source.

22. The system according to claim 17, wherein there is a one-to-one correspondence between amplifiers in said plurality of amplifiers and quantization levels utilized for said quantized representation of said first signal.

23. The system according to claim 17, wherein the number of quantization levels utilized for said quantized representation of said first signal is determined based on the modulation present in said baseband signal.

24. The system according to claim 23, wherein said baseband signal is a quadrature amplitude modulated (QAM) signal.

* * * * *